(12) United States Patent
Ono et al.

(10) Patent No.: US 7,221,051 B2
(45) Date of Patent: May 22, 2007

(54) SEMICONDUCTOR DEVICE, MODULE FOR OPTICAL DEVICES, AND MANUFACTURING METHOD OF SEMICONDUCTOR DEVICE

(75) Inventors: Atsushi Ono, Yamatokoriyama (JP); Norito Fujihara, Minamikawachi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 159 days.

(21) Appl. No.: 11/038,420

(22) Filed: Jan. 21, 2005

(65) Prior Publication Data
US 2005/0161805 A1    Jul. 28, 2005

(30) Foreign Application Priority Data
Jan. 23, 2004    (JP) ............... 2004-016296

(51) Int. Cl.
*H01L 23/12*    (2006.01)
(52) U.S. Cl. ............ 257/704; 257/621; 257/698; 257/434; 257/E23.011

(58) Field of Classification Search .......... 257/704
See application file for complete search history.

(56) References Cited

U.S. PATENT DOCUMENTS

2002/0019069 A1*   2/2002   Wada ............... 438/69
2004/0077121 A1*   4/2004   Maeda et al. .......... 438/75

FOREIGN PATENT DOCUMENTS

| JP | 2001-351997 | 12/2001 |
| JP | 2002-94082 | 3/2002 |
| JP | 2002-329852 | 11/2002 |

* cited by examiner

*Primary Examiner*—Tu-Tu Ho
(74) *Attorney, Agent, or Firm*—Nixon & Vanderhye P.C.

(57) ABSTRACT

An image pickup element and a micro-lens part are formed on the front surface of a semiconductor substrate; through electrodes passing through the semiconductor substrate are formed; protruding parts protruding from the front surface toward a glass lid are formed in a thickness greater than the thickness of the micro-lens part on the through electrodes; and the protruding parts are interposed between the semiconductor substrate and the glass lid.

19 Claims, 11 Drawing Sheets

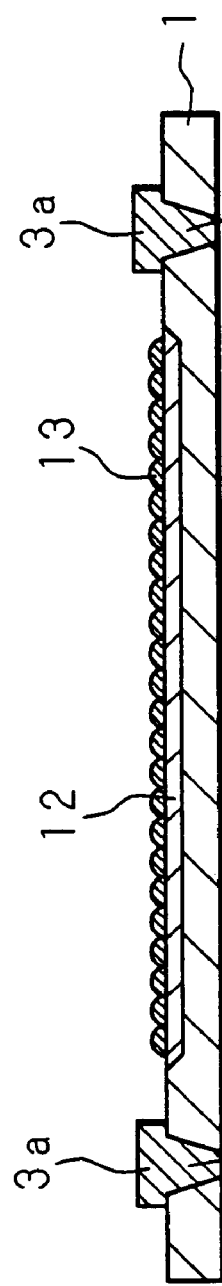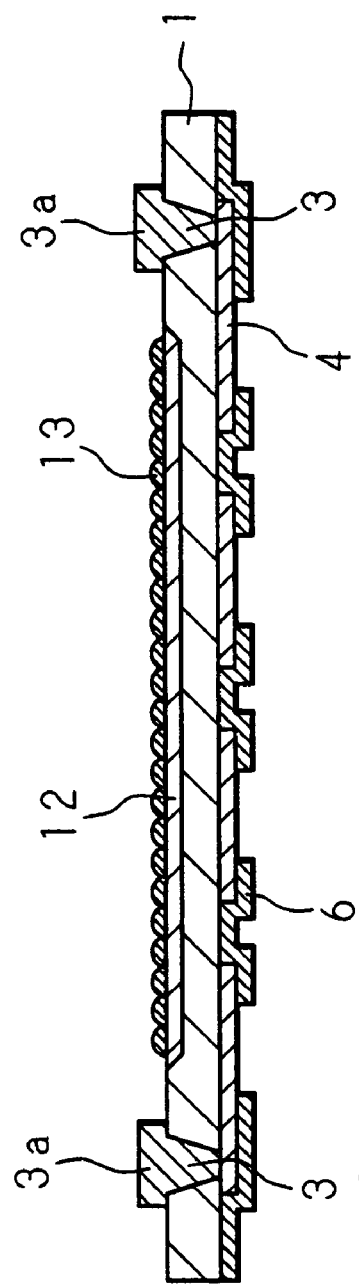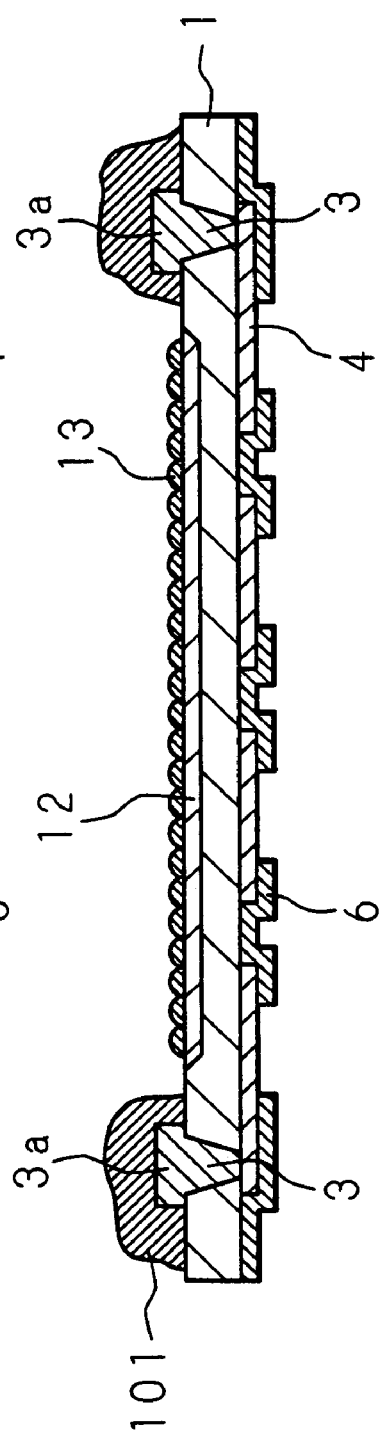
FIG. 8A
FIG. 8B
FIG. 8C

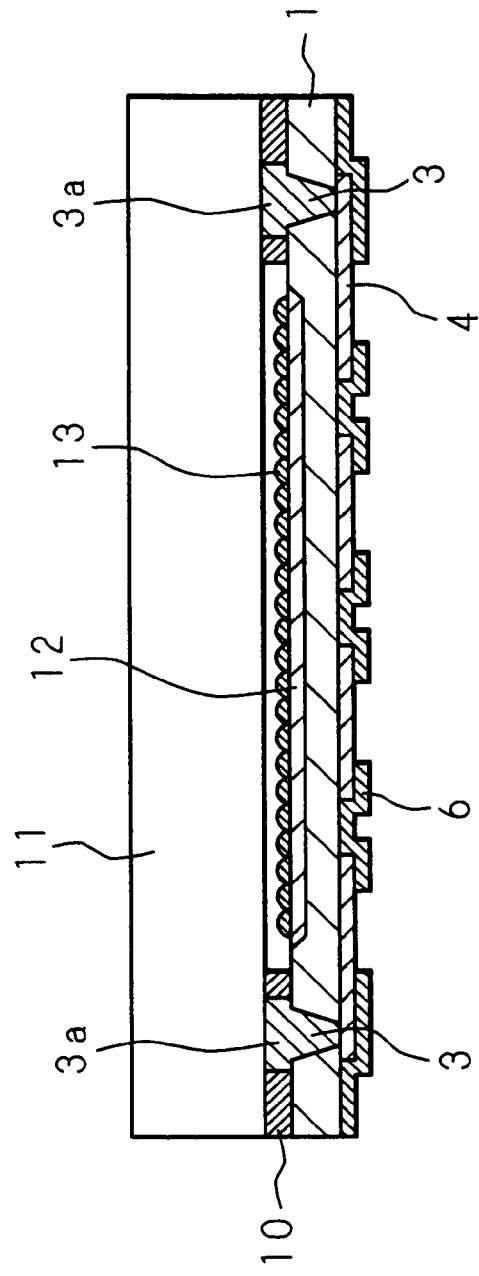
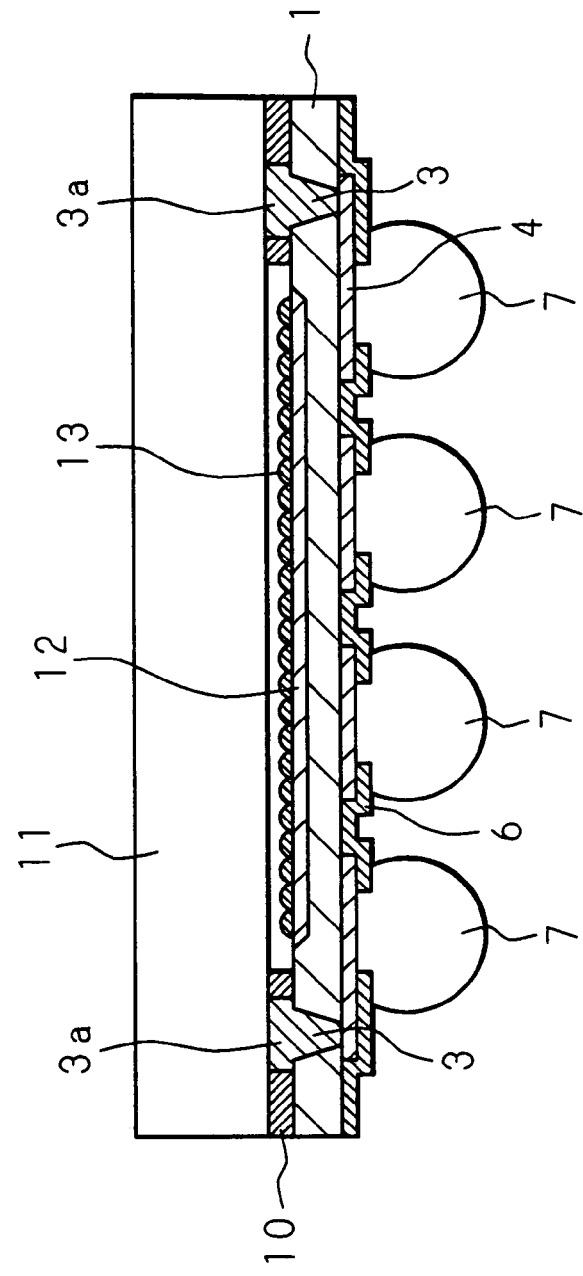
FIG. 9A
FIG. 9B

SEMICONDUCTOR DEVICE, MODULE FOR OPTICAL DEVICES, AND MANUFACTURING METHOD OF SEMICONDUCTOR DEVICE

CROSS-REFERENCE TO RELATED APPLICATIONS

This non-provisional application claims priority under 35 U.S.C. §119(a) on Patent Application No. 2004-16296 filed in Japan on Jan. 23, 2004, the entire contents of which are hereby incorporated by reference.

BACKGROUND OF THE INVENTION

The present invention relates to a semiconductor device comprising a semiconductor substrate where a semiconductor element and a through electrode are formed, and a lid member attached to the semiconductor substrate, and also relates to a module for optical devices, and a manufacturing method of the semiconductor device.

Conventionally, a package of CCD image sensor, CMOS image sensor or the like is used as a semiconductor device, and a sensor module such as a CCD image sensor, a CMOS image sensor or the like is used as a module for optical devices.

FIG. 1 is a cross sectional view showing the structure of a conventional semiconductor device. A light receiving element 113 is formed in one surface (front surface) of a semiconductor substrate 111 of the semiconductor device, and a micro-lens part 114 is formed on the light receiving element 113.

The other surface (rear surface) of the semiconductor substrate 111 is bonded (die-bonded) to the internal bottom surface of a box-shaped container 115 made of ceramic or synthetic resin with an adhesive 117 (die-bonding resin). The opening of the box-shaped container 115 is sealed by attaching a glass lid 112 with an adhesive 119, so the light receiving element 113 and micro-lens part 114 in the box-shaped container 115 are protected from the external environment. Moreover, an electrode pad 109 (bonding pad) mounted on the front surface of the semiconductor substrate 111 and an electrode lead 116 drawn out from the inside of the box-shaped container 115 are electrically connected with a bonding wire 118.

FIG. 2 is a cross sectional view showing the structure of the conventional module for optical devices. The module for optical devices shown in FIG. 2 comprises lenses 123, a cylindrical optical path defining device 122 holding the lenses 123, and a wiring board 120. Further, the module for optical devices comprises the semiconductor substrate 111 having the light receiving element 113, micro-lens part 114 and electrode pad 109. The rear surface of the semiconductor substrate 111 is die-bonded onto the wiring board 120 with the adhesive 117, and the electrode pad 109 is electrically connected through the bonding wire 118 to a conductor wiring 121 provided on the wiring board 120.

One opening of the optical path defining device 122 is sealed by the glass lid 112 positioned to face the lens 123 and an adhesive 119, and the other opening is sealed by the wiring board 120 and an adhesive (not shown), so the light receiving element 113 and micro-lens part 114 are protected from the external environment. Before sealing the optical path defining device 122, it is necessary to protect the light receiving element 113 and micro-lens part 114 by other means.

The above-mentioned semiconductor device and module for optical devices require a space for connecting the electrode pad 109 to the electrode lead 116 or the conductor wiring 121 by using the bonding wire 118. Moreover, the bonding wire 118, electrode pad 109, etc. cannot be arranged on the light receiving element 113 or the micro-lens part 114 because the light receiving element 113 is blocked from light. As a result, it is difficult to reduce the sizes of the semiconductor device and the module for optical devices.

Therefore, in recent years, there were proposals to reduce the size of a semiconductor device or a module for optical devices by forming a through electrode passing through a semiconductor substrate from the front surface to the rear surface and forming a wiring line and a mounting terminal on the rear surface of the semiconductor substrate (see Japanese Patent Applications Laid Open Nos. 2001-351997 and 2002-94082).

FIGS. 3A and 3B are cross sectional views showing the structure of another conventional semiconductor device. The semiconductor device shown in FIG. 3A comprises a semiconductor substrate 111 where a light receiving element 113 and a micro-lens part 114 are formed. However, through electrodes 124 extending from the front surface to the rear surface of the semiconductor substrate 111 are formed, and a rear surface wiring 125 and solder balls 126 which are mounting terminals are formed on the rear surface of the semiconductor substrate 111. The through electrode 124 and the solder ball 126 are electrically connected with the rear surface wiring 125.

Further, a glass lid 112 is attached to the semiconductor substrate 111 so that the semiconductor substrate 111 and the glass lid 112 are substantially parallel to each other with an appropriate distance therebetween. In this case, for example, an adhesive part 127 made of an adhesive paste is printed on the front surface of the semiconductor substrate 111, the glass lid 112 is placed on the printed adhesive part 127, and then the adhesive part 127 is hardened by heat treatment. The hardened adhesive part 127 fastens the glass lid 112 to the semiconductor substrate 111 and supports it.

Such an adhesive part 127 is provided on the peripheral portion of the front surface of the semiconductor substrate 111 by avoiding the light receiving element 113 and micro-lens part 114. However, if the adhesive part 127 is formed by using an adhesive having a light transmitting property (for example, a transparent resin or low-melt point glass), the adhesive part 127 may be formed on the front surface of the semiconductor substrate 111, including the surface over the light receiving element 113 and micro-lens part 114. The space between the semiconductor substrate 111 and the glass lid 112 is sealed by the adhesive part 127, and the light receiving element 113 and micro-lens part 114 are protected from the external environment.

However, the adhesive part 127 of the conventional semiconductor device had a low hardness before hardened, and therefore as shown in FIG. 3B, the glass lid 112 sometimes sank into the adhesive part 127, decreased the distance between the glass lid 112 and the semiconductor substrate 111, and came into contact with the micro-lens part 114, light receiving element 113, etc. In this case, there was a problem that the micro-lens part 114 or the light receiving element 113 was damaged.

Moreover, the glass lid 112 sometimes tilted due to sinking of the glass lid 112 into the adhesive part 127. In this case, there was a problem that the light incident through the glass lid 112 could not be accurately received by the light receiving element 113.

For the above-mentioned problems, it was considered to form the adhesive part 127 in advance by using an adhesive with high hardness so as to prevent the glass lid 112 from sinking into the adhesive part 127. In this case, even when the glass lid 112 is mounted on the adhesive part 127, it is possible to prevent the glass lid 112 from sinking into the adhesive part 127. However, in order to seal the space between the glass lid 112 and semiconductor substrate 111 by securely bonding the adhesive part 127 and the glass lid 112 and semiconductor substrate 111, it is necessary to apply higher pressure to the glass lid 112 and the semiconductor substrate 111 compared to forming the adhesive part 127 by using an adhesive of low hardness, and therefore there is a possibility that the semiconductor substrate 111 will be damaged during the application of pressure.

BRIEF SUMMARY OF THE INVENTION

The present invention has been made with the aim of solving the above problems, and it is an object of the present invention to provide a semiconductor device capable of preventing tilting of a lid member, damage to a semiconductor substrate or parts formed on the semiconductor substrate due to the lid member, and damage to the semiconductor substrate due to the application of pressure by interposing a protruding part formed on the semiconductor substrate between the semiconductor substrate and the lid member, and to provide a module for optical devices comprising the semiconductor substrate, and a manufacturing method of the semiconductor device.

Another object of the present invention is to provide a semiconductor device capable of preventing damage to a micro-lens due to the lid member by forming the protruding part in a thickness greater than the thickness of the micro-lens, and to provide a manufacturing method of the semiconductor device.

Still another object of the present invention is to provide a semiconductor device capable of forming the protruding part easily at low costs by forming the protruding part and a through electrode integrally, or forming the protruding part by using the same material/means as the material/means for forming the through electrode, and to provide a manufacturing method of the semiconductor device.

A semiconductor device according to the present invention is a semiconductor device comprising a semiconductor substrate with a semiconductor element formed in one surface thereof; a through electrode formed in the semiconductor substrate; and a lid member attached to the semiconductor substrate to cover the semiconductor element, and characterized in that a protruding part protruding from the one surface toward the lid member is formed on the semiconductor substrate.

The semiconductor device according to the present invention is characterized in that a micro-lens is mounted on the one surface, and the protruding part has a thickness greater than the thickness of the micro-lens.

The semiconductor device according to the present invention is characterized in that the protruding part is formed integrally with the through electrode.

The semiconductor device according to the present invention is characterized in that the protruding part is formed on the one surface.

The semiconductor device according to the present invention is characterized in that the through electrode and the protruding part are formed by using the same conductive material.

The semiconductor device according to the present invention is characterized in that the protruding part is made of metal.

The semiconductor device according to the present invention is characterized in that the lid member has a light transmitting property, and the semiconductor element is a light receiving element or an image pickup element.

A module for optical devices according to the present invention is characterized by comprising: a semiconductor device of the present invention; and an optical path defining device for defining an optical path to the semiconductor device.

A manufacturing method of a semiconductor device according to the present invention is a method of manufacturing a semiconductor device by forming a semiconductor element in one surface of a semiconductor substrate, forming a through electrode in the semiconductor substrate, and attaching a lid member to the semiconductor substrate so as to cover the semiconductor element, and characterized by forming a protruding part protruding from the one surface on the semiconductor substrate before attaching the lid member, and attaching the lid member to the semiconductor substrate with the formed protruding part between the one surface and the lid member.

The manufacturing method of a semiconductor device according to the present invention is characterized by mounting a micro-lens on the one surface, wherein when forming the protruding part, the protruding part is formed in a thickness greater than the thickness of the micro-lens.

The manufacturing method of a semiconductor device according to the present invention is characterized in that the protruding part is formed integrally with the through electrode after forming the through electrode, or during the formation of the through electrode.

The manufacturing method of a semiconductor device according to the present invention is characterized in that the protruding part is formed by plating the semiconductor substrate.

The manufacturing method of a semiconductor device according to the present invention is characterized in that the protruding part is formed by printing a metallic paste on the semiconductor substrate and hardening the printed metallic paste.

According to the present invention, a through electrode passing through one surface and the other surface of the semiconductor substrate is provided. In the case where a through electrode is formed in a semiconductor substrate, in general, an attempt is made to reduce the size of the semiconductor device by attaching a lid member for covering the semiconductor element to the semiconductor substrate. Since the protruding part is formed on the semiconductor substrate to protrude from one surface of the semiconductor substrate where the semiconductor element is formed toward the lid member and interposed between the one surface of the semiconductor substrate and the lid member, the protruding part functions as a spacer for preventing the lid member from coming into contact with the semiconductor substrate, the semiconductor element or the respective parts mounted on the one surface of the semiconductor substrate (for example, the micro-lens mounted on the surface of the semiconductor element).

According to the present invention, a micro-lens is mounted on the one surface of the semiconductor substrate. In this case, in order to prevent the lid member from coming into contact with the micro-lens, the thickness of the protruding part (the length from the one surface of the semiconductor substrate to the top of the protruding part) is made greater than the thickness of the micro-lens (the length from the one surface of the semiconductor substrate to the top of the micro-lens).

Moreover, according to the present invention, for example, the protruding part is formed integrally with an end of the through electrode on the one surface side of the semiconductor substrate.

Further, according to the present invention, the protruding part is formed on the surface of the semiconductor element and/or the one surface of the semiconductor substrate except for the surface of the semiconductor element.

According to the present invention, in either case where the protruding part is formed integrally with the through electrode, or the protruding part is formed as a separate member, the protruding part is formed by using the same conductive material as the through electrode.

Moreover, according to the present invention, the protruding part is made of metal, and therefore formed, for example, by plating, or printing and hardening a metallic paste.

Further, the semiconductor device according to the present invention has the lid member with a light transmitting property, and a light receiving element or an image pickup element as the semiconductor element. Such a semiconductor device is, for example, a package of CCD image sensor or CMOS image sensor.

A module for optical devices according to the present invention comprises a semiconductor device of the present invention, and an optical path defining device. Such a module for optical devices is, for example, a CCD image sensor module or a CMOS image sensor module to be mounted in an optical device such as a camera.

According to the present invention, since the protruding part formed on the semiconductor substrate functions as a spacer between the semiconductor substrate and the lid member, it is possible to prevent damage to the semiconductor substrate, or the respective parts (semiconductor element, micro-lens, etc.) mounted on the semiconductor substrate, due to contact with the lid member.

Moreover, in the case where the lid member is attached to the semiconductor substrate with an adhesive, the protruding part as a spacer can prevent the lid member from sinking into the adhesive, and therefore there is no need to use an adhesive with high hardness to prevent sinking of the lid member, or there is no need to apply pressure excessively to the lid member and the semiconductor substrate during bonding. As a result, it is possible to prevent the semiconductor device from being damaged by the application of excessive pressure during bonding.

Further, in the case where the semiconductor device comprises a plurality of protruding parts, and the respective protruding parts have substantially the same thickness, or in the case where the semiconductor device comprises a single protruding part, and the thickness of the protruding part is substantially uniform, the protruding part(s) can support the lid member parallel to the semiconductor substrate. Therefore, if the lid member has a light transmitting property and the semiconductor element is a light receiving element or an image pickup element, the semiconductor element can accurately receive incident light. Such a semiconductor device and module for optical devices are optically advantageous.

Besides, in the case where a plurality of protruding parts are formed in a suitable pattern, or in the case where a single protruding part is formed in a suitable shape, the protruding part(s) can certainly prevent the lid member from sinking and can stably support the lid member.

For example, in the case where the lid member in the form of a plate is used and the peripheral portion of one surface of the lid member is bonded to the peripheral portion of one surface of the semiconductor substrate, for example, it is possible to protect the semiconductor element from coming into contact with outside objects by the lid member. In this case, since the semiconductor element is not covered with the adhesive for bonding the lid member to the semiconductor substrate, if the lid member has a light transmitting property and the semiconductor element is a light receiving element or an image pickup element, it is possible to prevent loss of incident light with respect to the semiconductor element due to the adhesive. Moreover, if the lid member is bonded to the entire peripheral portion of the one surface of the semiconductor substrate, the space between the semiconductor substrate and the lid member is sealed, and therefore it is also possible to certainly protect the semiconductor element from the external environment such as humidity.

Further, it may also be possible to bond the lid member to the whole one surface of the semiconductor substrate. In this case, since the semiconductor element is covered with the adhesive for bonding the lid member to the semiconductor substrate, it is possible to prevent the lid member from being detached. Additionally, it is possible to further protect the semiconductor element by the lid member and the adhesive.

According to the present invention, in the case where the semiconductor element is a light receiving element, an image pickup element or the like, a micro-lens is mounted on the semiconductor element. It is therefore possible to improve the efficiency of gathering light onto the semiconductor element. Moreover, since the thickness of the protruding part is greater than the thickness of the micro-lens, it is possible to prevent the lid member from coming into contact with the micro-lens.

Further, according to the present invention, since the protruding part and the through electrode are a single member, it is possible to form the protruding part simultaneously with or following the through electrode formation step. As a result, there is no need to provide an additional step for forming the protruding part, thereby preventing an increase in the number of processing steps due to the formation of the protruding part. In general, since nothing is mounted on the through electrode on the one surface side, it is possible to form the protruding part here, and it is not necessary to provide the space for the protruding part in other portion. Moreover, it is possible to prevent an increase in the size of the semiconductor device due to the protruding part.

Further, according to the present invention, since the protruding part is formed on the surface of the semiconductor element and/or the one surface except for the surface of the semiconductor element, it is possible to prevent an increase in the size of the semiconductor device due to the protruding part.

Besides, according to the present invention, since the protruding part is formed by using the same conductive material as the through electrode, there is no need to prepare other material for forming the protruding part. As a result, it is possible to reduce an increase in the material costs due to the formation of the protruding part. Moreover, it is also possible to form the protruding part simultaneously with or following the through electrode formation step. Consequently, there is no need to provide an additional step for forming the protruding part, thereby preventing an increase in the number of processing steps due to the formation of the protruding part.

Further, according to the present invention, the protruding part is made of metal, and can be formed by plating, or printing and hardening a metallic paste. Since the through electrode can also be formed by plating, or printing and hardening the metallic paste, it is possible to use the facility for forming the through electrode as the facility for forming the protruding part. In addition, it is possible to form the protruding part simultaneously with or following the through electrode formation step. As a result, there is no need to additionally provide the step or facility of forming the protruding part, thereby preventing an increase in the number of steps and the facility costs due to the formation of the protruding part.

Moreover, according to the present invention, since the semiconductor device has the lid member with a light transmitting property and a light receiving element or an image pickup element as the semiconductor element, it is possible to construct a module for optical devices to be incorporated as a package of CCD image sensor, CMOS image sensor or the like into an optical device such as a digital camera or a mobile phone having a camera function.

Further, since the module of the present invention comprises a semiconductor device of the present invention and an optical path defining device, it can be incorporated as a CCD image sensor module or a CMOS image sensor module, for example, into an optical device such as a digital camera or a mobile phone having a camera function.

Besides, since the semiconductor device of the present invention is smaller than a conventional semiconductor device with no through electrode, the prevent invention has advantageous effects, such as enabling a reduction in the size of a module for optical devices, comprising a small-sized semiconductor device.

The above and further objects and features of the invention will more fully be apparent from the following detailed description with accompanying drawings.

BRIEF DESCRIPTION OF THE SEVERAL VIEWS OF THE DRAWINGS

FIGS. 8A through 8C are explanatory views of a manufacturing method of the semiconductor device according to Embodiment 1 of the present invention;

FIGS. 9A and 9B are explanatory views of a manufacturing method of the semiconductor device according to Embodiment 1 of the present invention;

DETAILED DESCRIPTION OF THE INVENTION

The following description will explain in detail the present invention, based on the drawings illustrating some embodiments thereof. A semiconductor device illustrated as an example in this embodiment is a CSP (Chip-Size Package) of CCD image sensor comprising a semiconductor substrate where an image pickup element as a semiconductor element is formed. However, the present invention is not limited to this, and may be, for example, a semiconductor device comprising a semiconductor substrate where a light receiving element, a light emitting element, etc. are formed.

Embodiment 1

Figure 1:
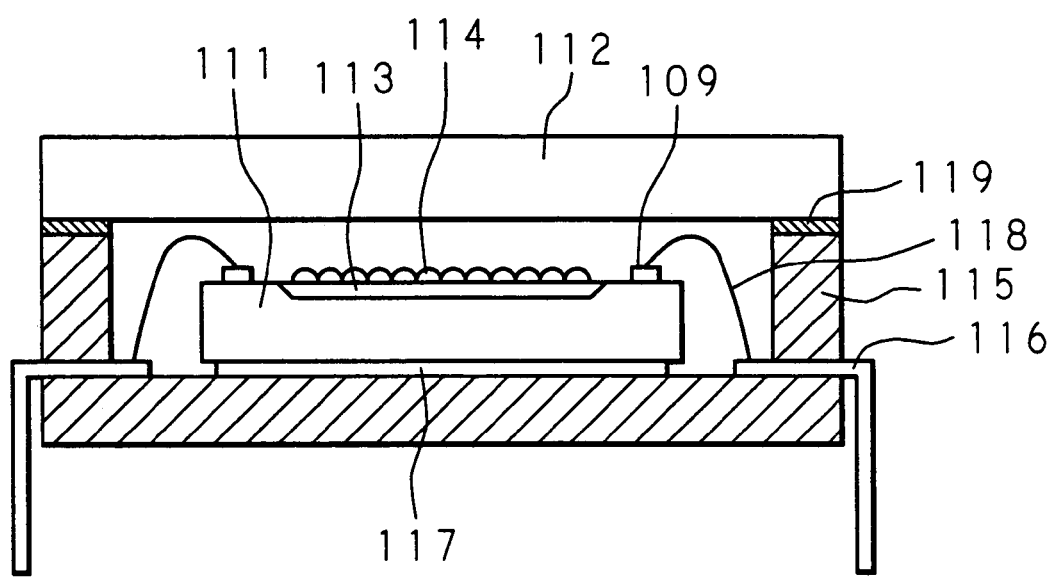
FIG. 1 is a cross sectional view showing the structure of a conventional semiconductor device.
Figure 2:
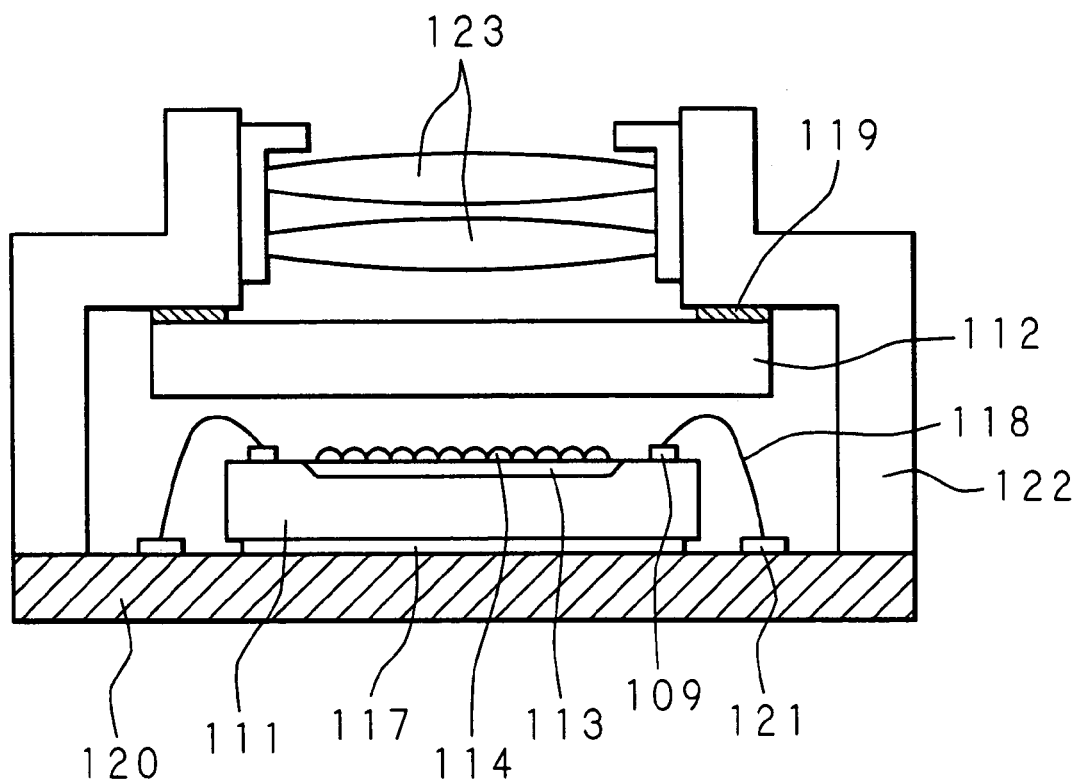
FIG. 2 is a cross sectional view showing the structure of a conventional module for optical devices.
Figure 3A:
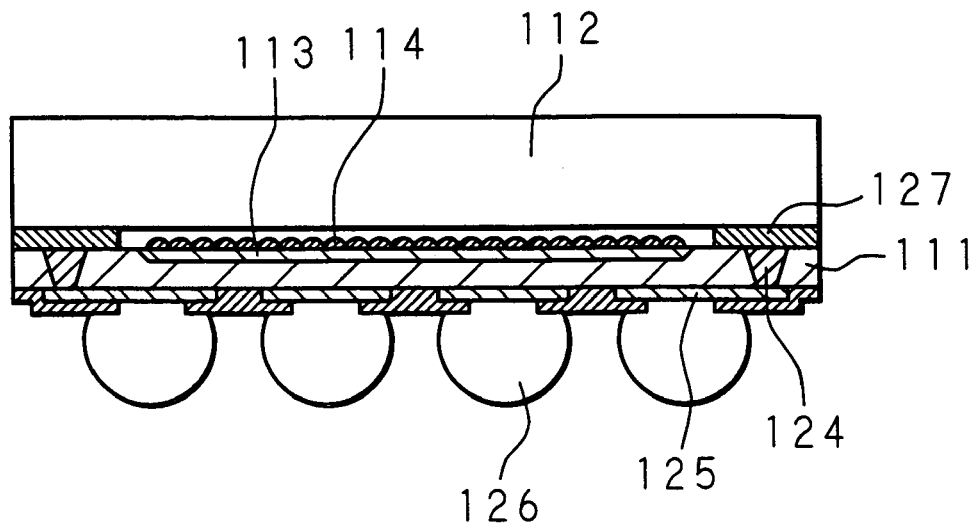
FIGS. 3A and 3B are cross sectional views showing the structure of another conventional semiconductor device.
Figure 3B:
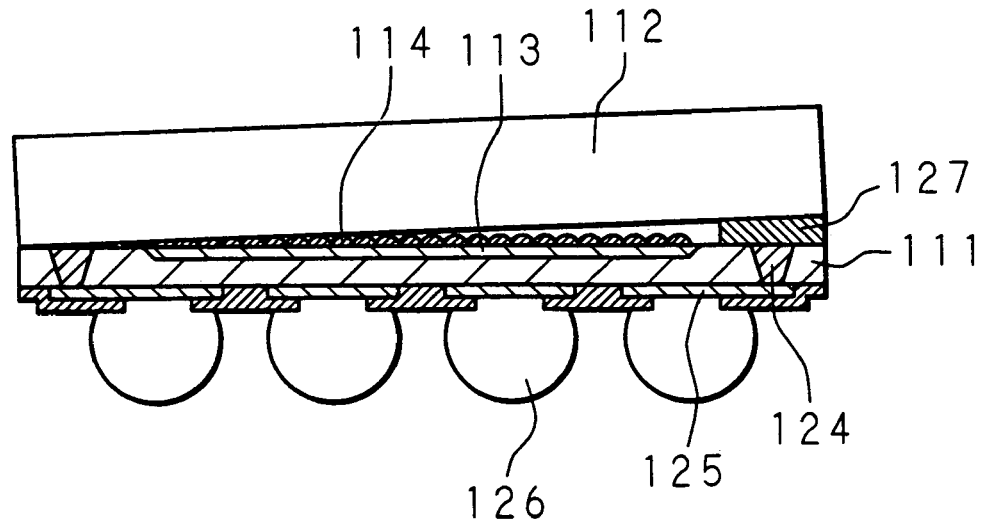
Figure 4:
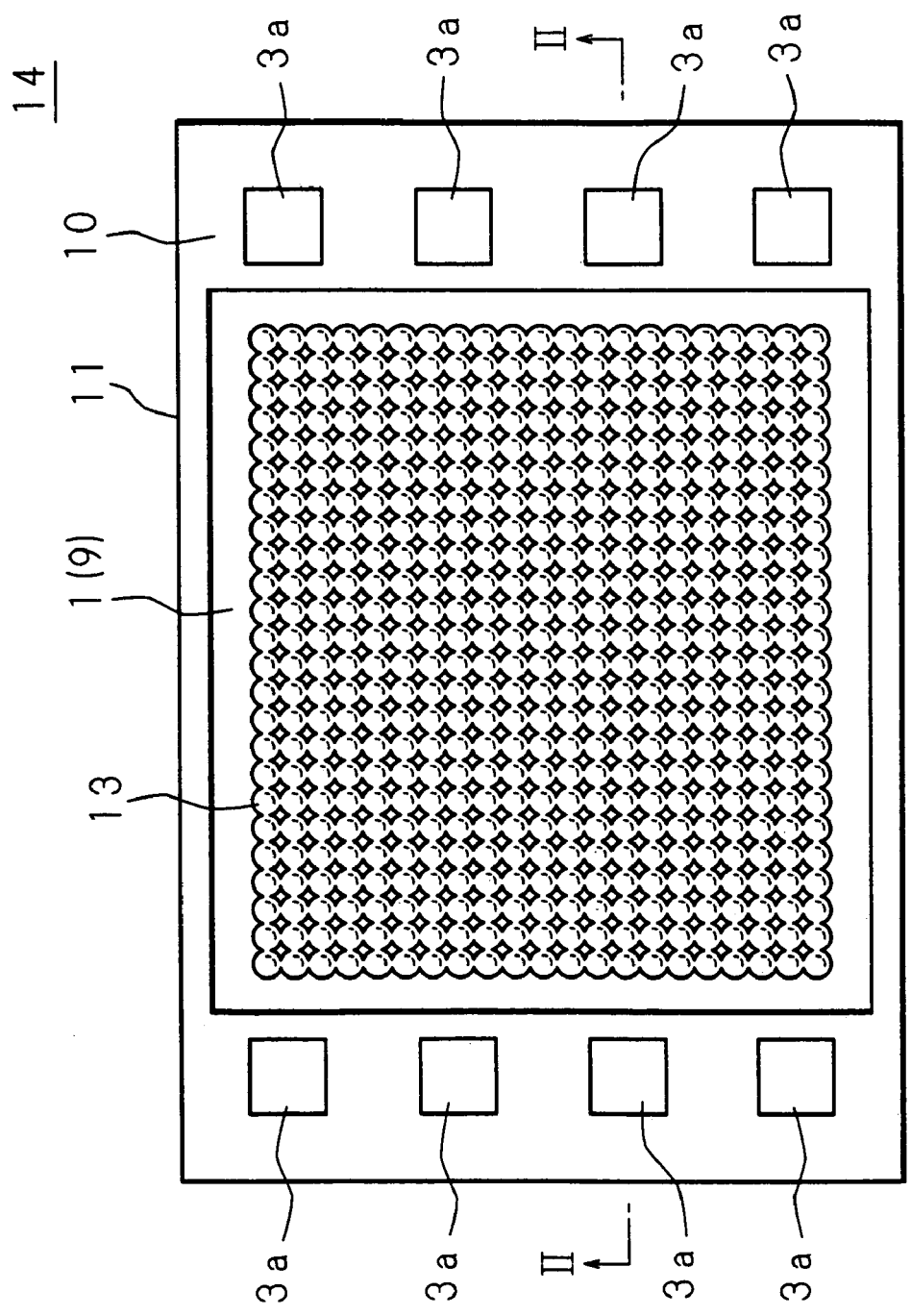
FIG. 4 is a plan view showing the structure of a semiconductor device according to Embodiment 1 of the present invention.
Figure 5:
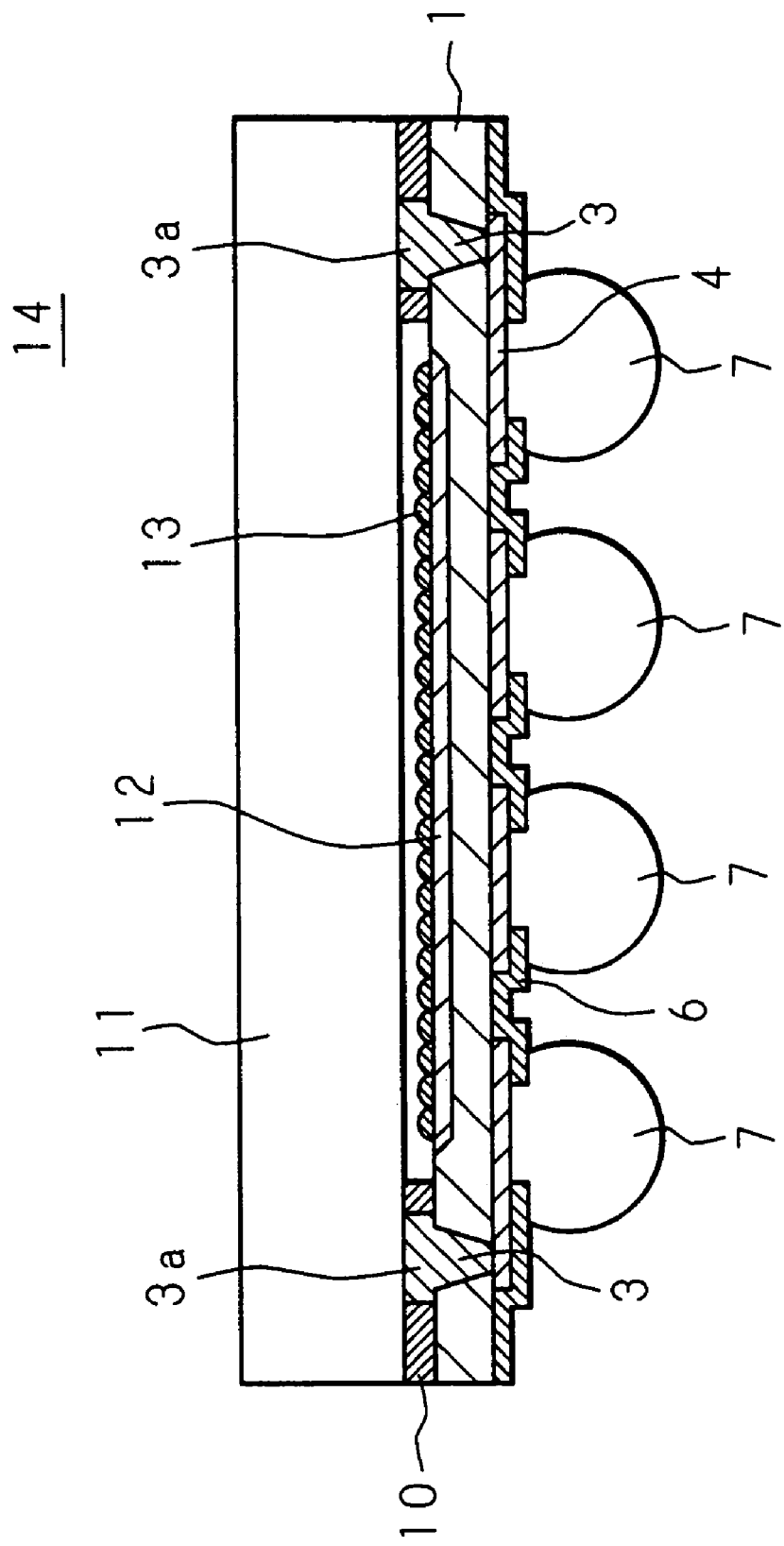
FIG. 5 is a cross sectional view showing the structure of the semiconductor device according to Embodiment 1 of the present invention.
Figure 6:
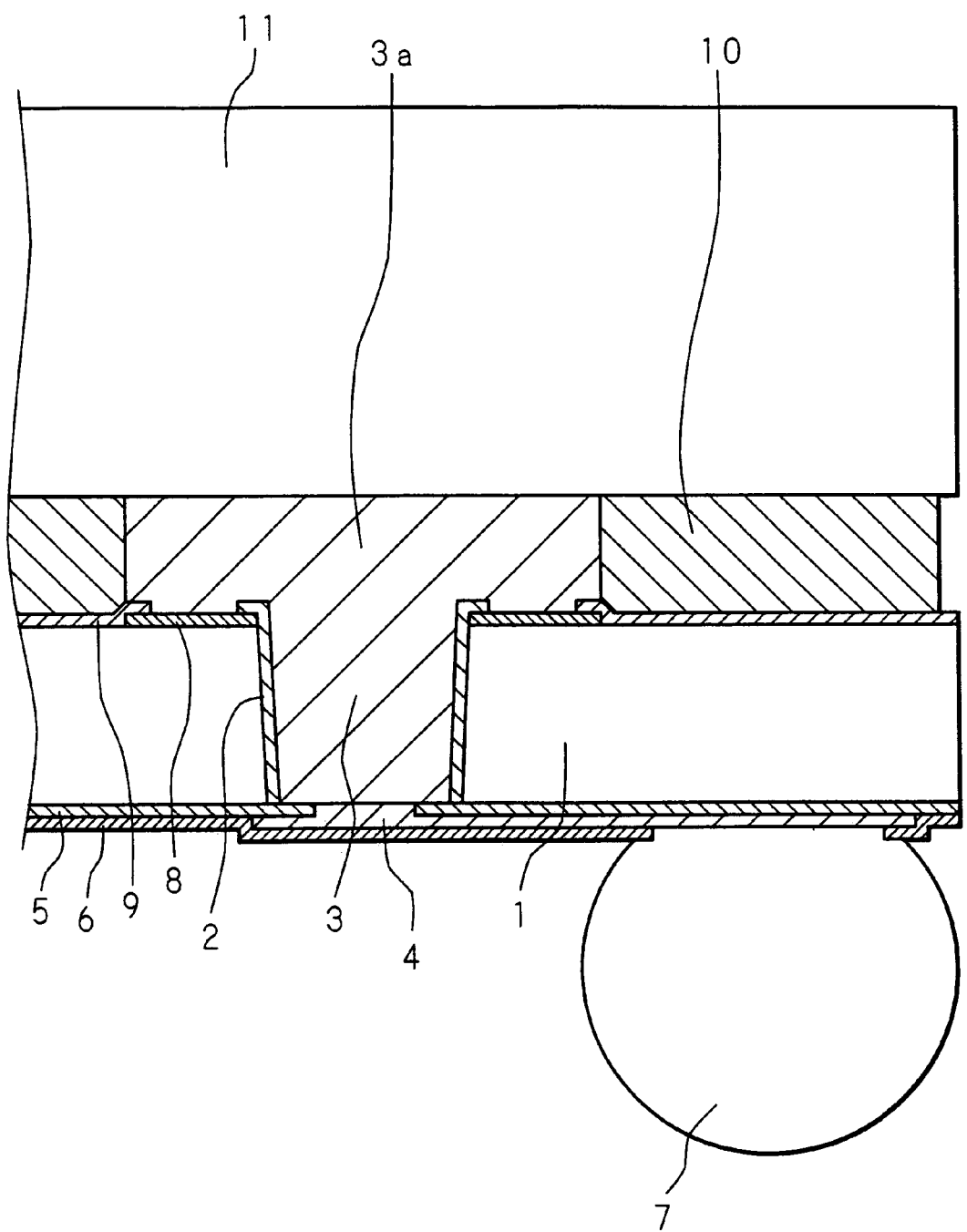
FIG. 6 is an enlarged cross sectional view showing the structures of a through electrode and protruding part of the semiconductor device according to Embodiment 1 of the resent invention.

FIG. 4 is a plan view showing the structure of a semiconductor device 14 according to Embodiment 1 of the present invention. FIG. 5 is a cross sectional view showing the structure of the semiconductor device 14, and a cross section along the II—II line of FIG. 4. Further, FIG. 6 is an enlarged cross sectional view showing the structures of a through electrode 3 and a protruding part 3a of the semiconductor device 14, and an enlarged view of the vicinity of one through electrode 3 and protruding part 3a shown in FIG. 5. In FIG. 5, however, illustration of a through hole insulation film 2, a rear surface insulation film 5, an electrode pad 8, and a front surface protection film 9 shown in FIG. 6 is omitted.

As shown in FIGS. 4 and 5, the semiconductor device 14 comprises a semiconductor substrate 1 having a rectangular shape in the plan view. The semiconductor substrate 1 is a flat plate made of Si, for example, and an image pickup element 12 having a rectangular shape in the plan view is formed in one surface of the semiconductor substrate 1. The image pickup element 12 has many pixel arrays, and each pixel functions as a light receiving sensor. In order to improve the light gathering efficiency of the image pickup element 12, a micro-lens part 13 comprising many microlenses corresponding one-to-one with the pixels of the image pickup element 12 is formed on the surface of the image pickup element 12.

Here, the one surface of the semiconductor substrate 1 where the image pickup element 12 is formed is referred to as the front surface of the semiconductor substrate 1, and the other surface where the image pickup element 12 is not formed is referred to as the rear surface of the semiconductor substrate 1. The semiconductor substrate 1 comprises a plurality of through electrodes 3, 3, . . . passing through the front surface and the rear surface. The through electrodes 3, 3, . . . are located with an appropriate distance therebetween and at an appropriate distance from the image pickup element 12 and micro-lens part 13 to enclose the image pickup element 12 and micro-lens part 13. The number and layout of the through electrodes 3, 3, . . . are set according to the necessity of wiring for the image pickup element 12.

The semiconductor substrate 1 comprises protruding parts 3a, 3a, . . . corresponding one-to-one with the through electrodes 3, 3, . . . . Each protruding part 3a is formed integrally with a corresponding through electrode 3, and protrudes from the front surface of the semiconductor substrate 1 toward a later-described glass lid 11. Each protruding part 3a has a rectangular shape in the plan view, a horizontal surface at the top, and a thickness greater than the thickness of the micro-lens part 13. The thicknesses of the respective protruding parts 3a, 3a, ... are substantially equal to each other. In this embodiment, the protruding parts 3a, 3a, ... are formed on one end of the through electrodes 3, 3, ... on the front surface side of the semiconductor substrate 1, and the shape, thickness, number and layout of the protruding parts 3a, 3a, ... are set so as to stably support the glass lid 11. Therefore, the semiconductor substrate 1 may have a through electrode 3 on which no protruding part 3a is formed.

In addition to or in place of the protruding parts 3a, 3a, ... on the through electrodes 3, 3, ..., the semiconductor substrate 1 may have protruding parts in a shape different from that of the protruding parts 3a, 3a, ... on the front surface of the semiconductor substrate 1 at appropriate distances away from the through electrodes 3, 3, ..., image pickup element 12 and micro-lens part 13. The shape, thickness, number and layout of the protruding parts are set so as to stably support the glass lid 11. The material of the protruding parts may be the same conductive material as or different conductive material from the material of the through electrodes 3, 3, ... (and the protruding parts 3a, 3a, ... ), and is not limited to metallic material or non-metallic material. In either case, since each protruding part is not formed on the image pickup element 12, it does not interfere with reception of light by the image pickup element 12.

The semiconductor device 14 comprises the glass lid 11 (lid member with a light transmitting property) in the form of a rectangular flat plate whose size in the plan view is substantially equal to the size of the semiconductor substrate 1. By placing the glass lid 11 on the protruding parts 3a, 3a, ... , it is positioned substantially parallel to the semiconductor substrate 1 with an appropriate distance therebetween. In this case, the glass lid 11 covers the image pickup element 12 and the micro-lens part 13, and the protruding parts 3a, 3a, ... function as spacers between the semiconductor substrate 1 and the glass lid 11.

Moreover, each protruding part 3a and the glass lid 11, and the semiconductor substrate 1 and glass lid 11 are attached to each other by an adhesive seal part 10 made of a synthetic resin adhesive. The adhesive seal part 10 is formed on the peripheral portion of the semiconductor substrate 1 at appropriate distances away from the image pickup element 12 and micro-lens part 13. Further, the adhesive seal part 10 seals the peripheral portions of the semiconductor substrate 1 and glass lid 11. Therefore, the image pickup element 12 and micro-lens part 13 between the semiconductor substrate 1 and the glass lid 11 are protected from humidity, adhesion or contact of foreign matter, etc.

As a result, after attaching the glass lid 11 to the semiconductor substrate 1, no additional step is required to protect the image pickup element 12 and micro-lens part 13, thereby simplifying the manufacturing process of the semiconductor device 14. Besides, the manufacturing yield of the semiconductor device 14 is improved, and the reliability of the semiconductor device 14 is improved.

As shown in FIG. 6, in the semiconductor substrate 1, the through hole passing from the front surface through the rear surface of the semiconductor substrate 1 is formed, the through hole insulation film 2 is formed on the inner wall of the through hole, and the through electrode 3 is formed in the through hole with the through hole insulation film 2 therebetween. Therefore, the through electrode 3 and the semiconductor substrate 1 are electrically insulated from each other.

The area of the protruding part 3a is greater than the area of an opening of the through hole on the front surface side, and consequently the protruding part 3a is formed on the through electrode 3 and the front surface of the semiconductor substrate 1. However, the electrode pad 8 in the form of a film is interposed between the protruding part 3a and the front surface of the semiconductor substrate 1. Moreover, the front surface protection film 9 is formed on the front surface of the semiconductor substrate 1, except for the electrode pad 8, and an insulation film (not shown) is formed under the electrode pad 8 and the front surface protection film 9. The adhesive seal part 10 and the semiconductor substrate 1 are bonded together with the front surface protection film 9 and insulation film therebetween.

A rear surface insulation film 5 is formed on the rear surface of the semiconductor substrate 1 by avoiding the rear-surface side opening of the through hole, and a rear surface wiring 4 in the form of a film electrically connected to the through electrode 3 from the rear surface side of the through hole is stacked on the central portion of the rear-surface side opening of the through hole and a part of the rear surface insulation film 5. Further, a rear surface protection film 6 is stacked on other portion of the rear surface insulation film 5 and a part of the rear surface wiring 4, and a solder ball 7 electrically connected to the rear surface wiring 4 is formed as a bump using solder on other portion of the rear surface wiring 4.

In the semiconductor device 14 as described above, the through electrode 3 electrically connects the front surface side and rear surface side of the semiconductor substrate 1. External light of the semiconductor device 14 passes through the glass lid 11, the space between the glass lid 11 and the micro-lens part 13, and the micro-lens part 13 in this order, and is incident on the image pickup element 12. In this case, the image pickup element 12 and micro-lens part 13 function as a CCD, and photo-electrically converted electric signals are taken out of the semiconductor device 14 through the through electrodes 3, 3, ..., rear surface wiring 4 and solder ball 7.

Moreover, since the glass lid 11 is placed on the protruding parts 3a, 3a, ..., the semiconductor substrate 1 and the glass lid 11 are substantially parallel, and the glass lid 11 and the micro-lens part 13 are separate from each other. As a result, it is possible to prevent the glass lid 11 from coming into contact with the image pickup element 12 or the micro-lens part 13 and damaging them, and the light incident through the glass lid 11 is correctly received by the image pickup element 12.

Further, since the adhesive seal part 10 is formed on the peripheral portion of the semiconductor substrate 1 and glass lid 11, a space is provided between the glass lid 11 and the image pickup element 12 and micro-lens part 13. In other words, no adhesive part is present between the glass lid 11 and the image pickup element 12 and micro-lens part 13. As a result, it is possible to prevent attenuation and scattering of incident light due to the adhesive part, and the incident light is correctly received by the image pickup element 12.

Note that although the lid member of this embodiment is made of glass, it may also be possible to use a lid member made of a synthetic resin. Moreover, the lid member has a light transmitting property to allow light to be incident on the image pickup element 12, but if light is not incident on the semiconductor element formed in the semiconductor substrate 1, or if the semiconductor element does not radiate light, it is not necessary for the lid member to have a light transmitting property.

FIGS. 7A–7C, FIGS. 8A–8C, and FIGS. 9A–9B are explanatory views of a manufacturing method of the semiconductor device 14, and FIGS. 7A–7C, FIGS. 8A–8C, and FIGS. 9A–9B show cross sections of the respective parts. However, in FIGS. 7A–7C, FIGS. 8A–8C, and FIGS. 9A–9B, illustration of the through hole insulation film 2, rear surface insulation film 5, electrode pad 8 and front surface protection film 9 is omitted.

The semiconductor device 14 is manufactured by forming a plurality of semiconductor devices 14, 14, . . . on one piece of semiconductor substrate (semiconductor wafer) and dividing the semiconductor substrate into individual semiconductor devices 14. Alternatively, the semiconductor device 14 (CSP) is manufactured by forming a plurality of image pickup elements 12, micro-lens parts 13, through electrodes 3, protruding parts 3a, etc. on a semiconductor wafer, dividing the semiconductor wafer into individual semiconductor substrates 1 (semiconductor chips), attaching the glass lid 11 to each of the individual semiconductor substrates 1, and forming the solder ball 7 on each of the individual semiconductor substrates 1. The following explanation is given by noting one semiconductor device 14.

Figure 7A:
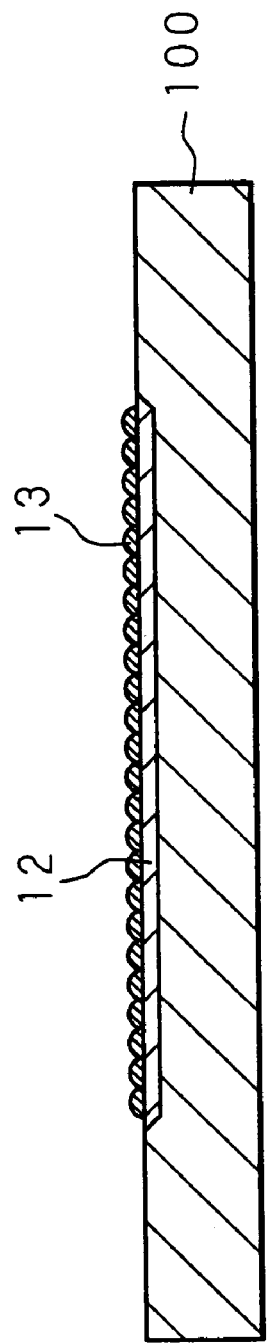
FIGS. 7A through 7C are explanatory views of a manufacturing method of the semiconductor device according to Embodiment 1 of the present invention.

First, the image pickup element 12, a peripheral circuit (not shown) including the electrode pad 8, the micro-lens part 13, etc. are formed on one surface of a semiconductor substrate 100 (FIG. 7A). The semiconductor substrate 100 is thicker than the semiconductor substrate 1 shown in FIG. 4 through FIG. 6, is a flat plate made of Si, and becomes a semiconductor substrate 1 at the time point of FIG. 8A as to be described later. The one surface of the semiconductor substrate 100 corresponds to the front surface of the semiconductor substrate 1, and the image pickup element 12 is formed in the one surface of the semiconductor substrate 100. After forming the image pickup element 12 and the peripheral circuit including the electrode pad 8, a light-transmitting insulation film (not shown) is formed on the one surface of the semiconductor substrate 100 including the surface of the image pickup element 12.

After forming the insulation film, the micro-lens part 13 is mounted on the image pickup element 12 with the insulation film, a light-transmitting flattening film and color filters (all of which are not shown) therebetween. After forming the micro-lens part 13, a protection film is formed by using SiO2, SiN4, etc., and then the front surface protection film 9 is formed by removing the protection film on the electrode pad 8 from the formed protection film.

Figure 7B:
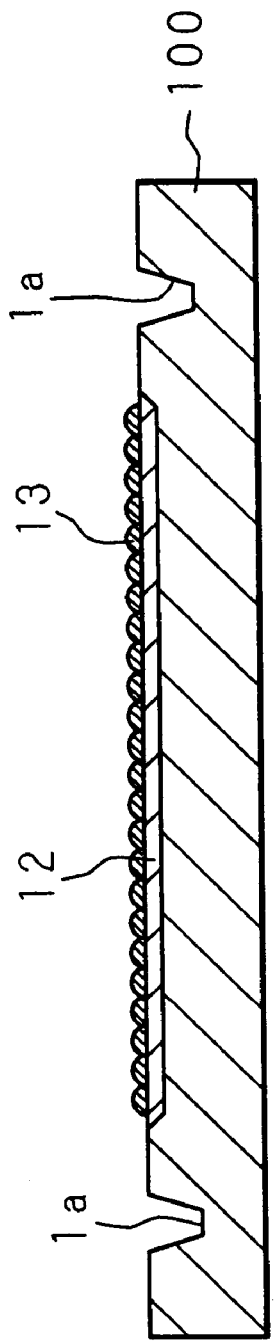

After forming the front surface protection film 9, a plurality of holes 1a, 1a, . . . are formed in the one surface of the semiconductor substrate 100 (FIG. 7B). First, a resist is applied to the one surface of the semiconductor substrate 100, and then exposure and development are performed to open a window on the electrode pad 8. Next, a resist window opening portion is etched by dry etching to remove the electrode pad 8, the insulation film under the electrode pad 8 and Si of the semiconductor substrate 100 in the window opening portion, and consequently the holes 1a, 1a, . . . are formed and the resist is finally removed. Note that it may also be possible to remove the electrode pad 8 and the insulation film in the window opening portion by wet etching, for example, before dry etching. It may also be possible to remove the insulation film or the electrode pad 8 in the portions where the hole sections 1a, 1a, . . . are formed in advance when forming the insulation film under the electrode pad 8, or when forming the electrode pad 8.

The hole sections 1a, 1a, . . . do not penetrate through the semiconductor substrate 100, and the opening of each hole 1a has 50 μm to 100 μm in four sides and a depth of 100 μm to 150 μm. The position and depth of each hole section 1a are substantially equal to the position and depth of each through hole of the semiconductor substrate 1.

Figure 7C:
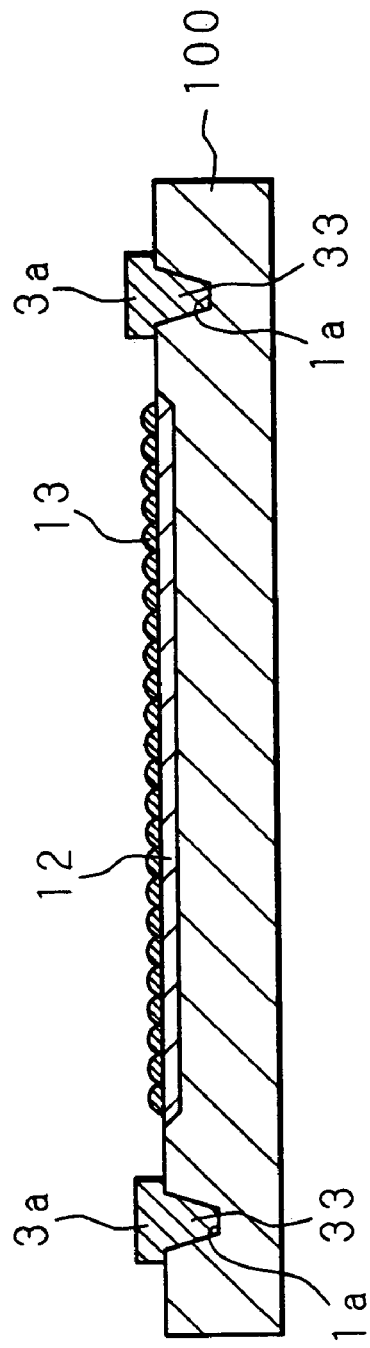

After forming the holes 1a, 1a, . . . , the metal parts 33, 33, . . . and protruding parts 3a, 3a, . . . to be the through electrodes 3, 3, . . . at the time point of FIG. 8A are formed in the holes 1a, 1a, . . . by electroplating using Cu (FIG. 7C). The metal parts 33, 33, . . . and the protruding parts 3a, 3a, . . . are formed by filling each hole 1a with each metal part 33 and making the thicknesses of the protruding parts 3a protruding on the one surface side of the semiconductor substrate 100 substantially equal to each other and thicker than the thickness of the micro-lens part 13. Note that the material of the metal parts 33, 33, . . . and protruding parts 3a, 3a, . . . is not necessarily be Cu, and it is possible to use conductive materials suitable for plating.

The following description will illustrate in detail the procedure of forming the metal part 33 and protruding part 3a by noting one hole 1a. After forming the hole 1a, an insulation film (not shown) to be the through hole insulation film 2 at the time point of FIG. 8A is formed on the inner wall and bottom of the hole 1a. Such an insulation film is formed by, for example, forming an inorganic film such as SiO2 and Si3N4 in the hole 1a by a CVD method, or coating the hole 1a with a polyimide-based or epoxy-based organic film. After forming the insulation film, a metal layer functioning as both a seed layer for plating and a barrier metal layer is formed on the front surface of the semiconductor substrate 100 including the inner wall and bottom of the hole 1a by a spattering method using Ti and Cu.

After forming the metal layer, a resist is applied thicker than the thickness of the micro-lens part 13, and then exposure and development are performed to open a window in the position where the hole 1a and electrode pad 8 are formed, that is, the position where the metal part 33 and protruding part 3a to be the through electrode 3 at the time point of FIG. 8A are formed, and consequently a resist window section is formed.

After forming the resist window section, Cu is deposited in the resist window section and on the metal layer in the hole 1a by Cu electroplating. At this time, since the resist window section and hole 1a are filled with Cu as a conductive material, the metal part 33 and the protruding part 3a made of metal are formed. The applied resist is removed after the formation of the metal part 33 and protruding part 3a. Since the protruding parts 3a, 3a, . . . are simultaneously formed by electroplating, the thicknesses of the protruding parts 3a, 3a, . . . are substantially equal to each other.

After forming the metal parts 33, 33, . . . and protruding parts 3a, 3a, . . . , the semiconductor substrate 100 becomes the semiconductor substrate 1, and the metal parts 33, 33, . . . become the through electrodes 3, 3, . . . (FIG. 8A). More specifically, the semiconductor substrate 1 is formed by polishing the other surface of the semiconductor substrate 100 and removing the Si on the other surface of the semiconductor substrate 100 including the bottom of the holes 1a, 1a, . . . and the insulation film on the bottom of the holes 1a, 1a, . . . . At this time, the bottom (end on the rear surface side of the semiconductor substrate 1) of the metal parts 33, 33, . . . is exposed, and makes the through electrodes 3, 3, . . . passing through the semiconductor substrate 1. Meanwhile, the remaining insulation film in the holes 1a, 1a, . . . becomes the through hole insulation film 2.

The other surface of the semiconductor substrate 100 is polished until the bottom of the metal parts 33, 33, . . . is exposed. Alternatively, the other surface of the semiconductor substrate 100 is polished, and polishing is finished by leaving only 5 µm to 30 µm-thick Si on the other surface of the semiconductor substrate 100 without exposing the metal parts 33, 33, . . . . Then, the remaining Si on the other surface is etched by RIE (reactive ion etching) to expose the bottom of the metal parts 33, 33, . . ., and finally the other surface is further polished by a CMP method to clean the rear surface of the semiconductor substrate 1.

In the above-described manner, the through hole 3 and protruding part 3a are integrally and simultaneously formed. Note that it may also be possible to integrally form the metal parts 33, 33, . . . and the protruding parts 3a, 3a, . . . by forming a print mask on the front surface protection film 9 except for the openings of the holes 1a, 1a, . . . and the periphery of the openings, instead of electroplating, after forming the insulation film in the holes 1a, 1a, . . . ; printing a conductive metallic paste on the portion where the print mask is not formed, namely, in the holes 1a, 1a, . . . and the periphery of the openings; and hardening the printed metallic paste. In this case, the protruding parts 3a, 3a, . . . can have a uniform thickness by adjusting the thickness of the print mask. Further, it may also be possible to form a through hole in the semiconductor substrate 1 by etching, laser irradiation or other method; form the through electrode 3 in the formed through hole by a CVD method, electroplating or other method; and then form the protruding part 3a.

After forming the semiconductor substrate 1 and through electrodes 3, 3, . . ., the rear surface wiring 4 and rear surface protection film 6 are formed on the rear surface of the semiconductor substrate 1 (FIG. 8B). In this case, the rear surface insulation film 5 is formed first, and then the rear surface wiring 4 connected to the through electrodes 3, 3, . . . is formed. Next, the rear surface protection film 6 is stacked on the rear surface insulation film 5 and rear surface wiring 4, except for portions (land portions) where the solder balls 7, 7, . . . are formed in FIG. 9B.

Here, the formation of the rear surface wiring 4, rear surface insulation film 5 and rear surface protection film 6 will be described in detail by noting one through electrode 3. After forming the through electrode 3 and protruding part 3a, the rear surface insulation film 5 is stacked on the rear surface of the semiconductor substrate 1, except for the bottom (end on the rear surface side of the semiconductor substrate 1) of the through electrode 3. The rear surface insulation film 5 is an insulation film for insulating the rear surface wiring 4 to be formed next from the semiconductor substrate 1.

For example, such a rear surface insulation film 5 is formed by performing exposure and development after stacking a photosensitive organic film on the rear surface of the semiconductor substrate 1 including the bottom of the through electrode 3; opening a window in a portion corresponding to the bottom of the through electrode 3; and then hardening the organic film by performing curing (heat cure) by heat treatment. Alternatively, the rear surface insulation film 5 is formed by applying a resist and performing exposure and development after stacking an inorganic film such as SiO2 and SiN4 on the rear surface of the semiconductor substrate 1 including the bottom of the through electrode 3; removing the inorganic film covering the bottom of the through electrode 3 by etching after opening a window in a portion corresponding to the through electrode 3; and finally removing the resist.

After forming the rear surface insulation film 5, a layer of the rear surface wiring 4 is formed on the bottom of the through electrode 3 and a predetermined position on the rear surface insulation film 5. In order to form the rear surface wiring 4, first, a metal layer functioning as both a seed layer for plating and a barrier metal layer are formed on the bottom of the through electrode 3 and the rear surface insulation film 5 by a spattering method using Ti and Cu. Next, a resist is applied, and a window opening section is formed in the bottom of the through electrode 3 and the predetermined position on the rear surface insulation film 5 by performing exposure and development. After forming the window opening section, the window opening section is filled with Cu by Cu electroplating, and the rear surface wiring 4 is formed. Finally, after removing the resist, the unnecessary metal layer covered by the resist is removed by etching.

Note that it may also be possible to form the rear surface wiring 4 by stacking a metal layer on the bottom of the through electrode 3 and the rear surface insulation film 5 by a spattering method using a metal (such as Cu, CuNi, and Ti) for forming the rear surface wiring 4, performing exposure and development after applying a resist, and etching.

After forming the rear surface wiring 4, the rear surface protection film 6 for protecting the rear surface wiring 4 is stacked on the rear surface wiring 4 and rear surface insulation film 5, except for a position where the solder ball 7 is formed at the time point of FIG. 9B. The rear surface protection film 6 is formed by opening a window at a position where the solder ball 7 is to be formed by performing exposure and development after stacking a photosensitive organic film on the rear surface wiring 4 and the rear surface insulation film 5, and then hardening the organic film by heat cure. Note that it may also be possible to form the rear surface protection film 6 by applying a resist and performing exposure and development after stacking an inorganic film such as SiO2 and SiN4 on the rear surface wiring 4 and the rear surface insulation film 5, and then performing etching to open a window in a position where the solder ball 7 is to be formed.

After forming the rear surface protection film 6, an adhesive part 101 made of a synthetic resin is formed apart from the image pickup element 12 and micro-lens part 13, on the front surface of the semiconductor substrate 1 including the top surfaces of the protruding parts 3a, 3a, . . . (FIG. 8C). The adhesive part 101 is formed by transferring the adhesive paste on the front surface of the semiconductor substrate 1 by printing, and becomes the adhesive seal part 10 at the time point of FIG. 9A. The adhesive part 101 thus formed has a suitable flexibility until it becomes the adhesive seal part 10.

After forming the adhesive part 101, the glass lid 11 is attached to the semiconductor substrate 1, and the adhesive part 101 is hardened to make the adhesive seal part 10 (FIG. 9A). In this case, first, the glass lid 11 is placed on the protruding parts 3a, 3a, . . . with the adhesive part 101 therebetween, and then pressure is applied to the semiconductor substrate 1 and the glass lid 11 until one surface (surface on the semiconductor substrate 1 side) of the glass lid 11 comes into contact with the top surfaces of the protruding parts 3a, and finally the adhesive part 101 is hardened by heat cure. Consequently, the adhesive seal part 10 is formed, and the semiconductor substrate 1, protruding parts 3a, 3a, . . . and glass lid 11 are fastened through the adhesive seal part 10. As a result, the space between the semiconductor substrate 1 and the glass lid 11 is sealed by the adhesive seal part 10.

Note that it may also be possible to form the adhesive seal part 10 by applying a photosensitive adhesive to the front surface of the semiconductor substrate 1 and performing exposure and development.

For attaching the glass lid 11 to the semiconductor substrate 1, the adhesive part 101 has flexibility, and therefore it is possible to prevent damage to the semiconductor substrate 1 during the application of pressure to the semiconductor substrate 1 and glass lid 11. Although the adhesive part 101 has flexibility, it is possible to prevent the glass lid 11 from sinking into the adhesive part 101, tilting, and coming into contact with the micro-lens part 13 or the image pickup element 12 because the protruding parts 3a, 3a, . . . are interposed as spacers between the semiconductor substrate 1 and the glass lid 11.

Regarding the glass lid 11 to be attached to the semiconductor substrate 1, one piece of glass lid 11 may be attached to an individual semiconductor substrate 1, or one piece of glass plate may be attached to a plurality of semiconductor substrates 1, 1, . . . and then divided into glass lids 11, 11, . . . . The area of the glass lid 11 can be smaller than the area of the semiconductor substrate 1 if it ensures contact with the protruding parts 3a, 3a, . . . . In this case, the size of the semiconductor device 14 is reduced. However, the area of the semiconductor substrate 1 needs to be greater than the image pickup element 12 and micro-lens part 13 to cover them.

After attaching the glass lid 11 to the semiconductor substrate 1, the solder balls 7, 7, . . . are formed on the rear surface of the semiconductor substrate 1 (FIG. 9B). In this case, first, a rosin-based flux is applied to the land portion (namely, the rear surface wiring 4, which is not covered with the rear surface protection film 6), and then Sn—Ag—Cu solder is formed into a ball shape and finally heat treatment is performed to clean and remove the flux.

Figure 10:
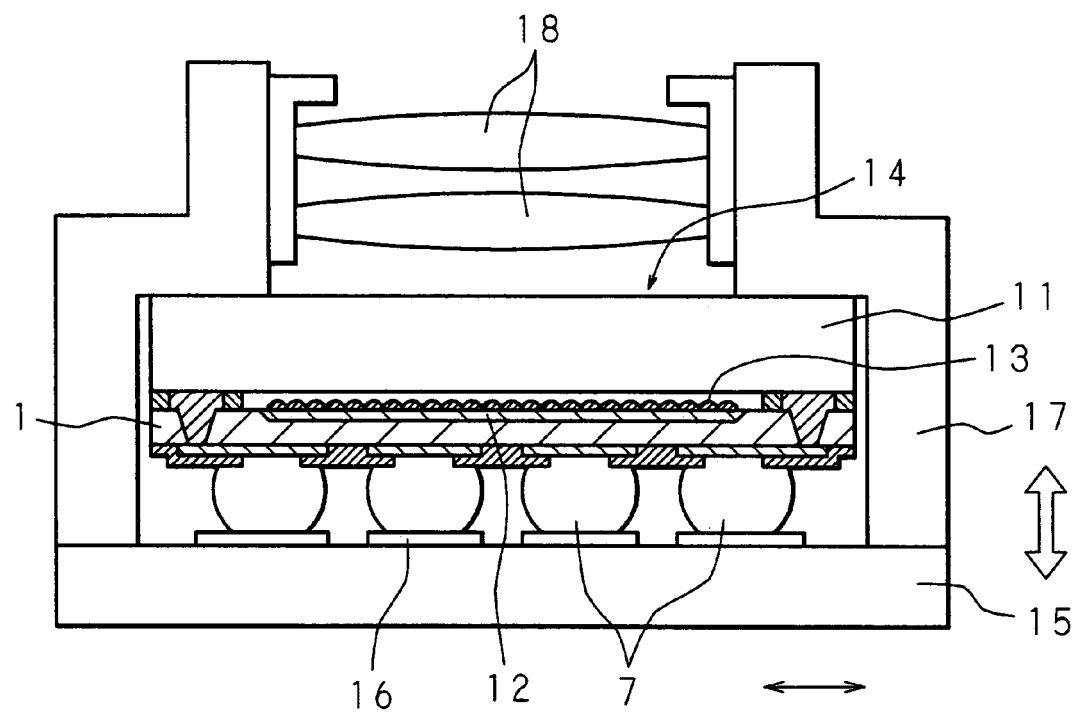
FIG. 10 is a cross sectional view showing the structure of a module for optical devices according to Embodiment 1 of the present invention.

FIG. 10 is a cross sectional view showing the structure of a module for optical devices according to Embodiment 1 of the present invention. The module for optical devices comprises a cylindrical optical path defining device 17. The optical path defining device 17 holds lenses 18 on one end, and has an opening on the other end closed by a wiring substrate 15 from outside of the optical path defining device 17. The other end of the optical path defining device 17 and the wiring substrate 15 are bonded and sealed by an adhesive part (not shown). A conductive wiring 16 is patterned at least on one surface of the wiring substrate 15, inside the optical path defining device 17.

The semiconductor device 14 is disposed in the optical path defining device 17 so that the rear surface of the semiconductor substrate 1 faces the wiring substrate 15, and the solder balls 7, 7, . . . and the conductor wiring 16 are electrically connected by flip-chip bonding.

The optical path defining device 17 in such a module for optical devices defines an optical path to the micro-lens part 13 and the image pickup element 12. The optical path defining device 17 also functions as a holder for holding the lenses 18 and as protective tools for protecting the semiconductor device 14, conductor wiring 16, etc. from the external environment.

The module for optical devices as described above does not require a connection between electrodes by bonding wire. Therefore, compared to a conventional module for optical devices that requires a bonding wire connection, the area in the width direction (arrow direction in FIG. 10) and the length in the thickness direction (open arrow direction in FIG. 10) are decreased by an amount corresponding to the space required for the bonding wire connection.

In the semiconductor device 14, the semiconductor substrate 1 and the glass lid 11 are integrally constructed. Moreover, since the semiconductor device 14 can be placed close to the optical path defining device 17 until the glass lid 11 comes into contact with the opening in one end (on the lens 18 side) of the optical path defining device 17 of the module for optical devices, the thickness of the module for optical devices is further reduced.

Additionally, since the image pickup element 12 and micro-lens part 13 are protected as they are sealed by the glass lid 11 and the adhesive seal part 10 before the semiconductor device 14 is placed in the optical path defining device 17, it is possible to prevent foreign matter from adhering to or coming into contact with the image pickup element 12 or the micro-lens part 13 and prevent the image pickup element 12 and the micro-lens part 13 from being broken during the manufacture of the module for optical devices. As a result, the manufacturing process of the module for optical devices is simplified. Further, the manufacturing yield of the module for optical devices is improved, and the reliability of the module for optical devices is improved.

Note that it may also be possible to construct the semiconductor device 14 by applying a solder paste to form a layer of solder electrode, instead of forming the solder balls 7, 7, . . . , and electrically connecting the formed solder electrode and the conductor wiring 16. In this case, the thickness of the module for optical devices is further reduced.

Moreover, the semiconductor device 14, or the module for optical devices comprising the semiconductor device 14, may also have color filters formed on the glass lid 11 or the micro-lens part 13, and an optical filter such as an infrared blocking film.

Further, it may also be possible to construct the module for optical devices without the wiring substrate 15 by bonding and sealing the semiconductor substrate 1 whose rear surface is exposed to outside the optical path defining device 17 and the other end of the optical path defining device 17. In this case, the size of the module for optical devices is reduced by an amount corresponding to the wiring substrate 15.

The module for optical devices comprising the above-mentioned semiconductor device 14 is mounted in an optical device such as a digital camera or a mobile phone with camera function. Since the plane projection area of the wiring substrate 15 and the optical path defining device 17 with respect to the area of the image pickup element 12 can be minimized, it is possible to realize high-density packing.

Embodiment 2

Figure 11:
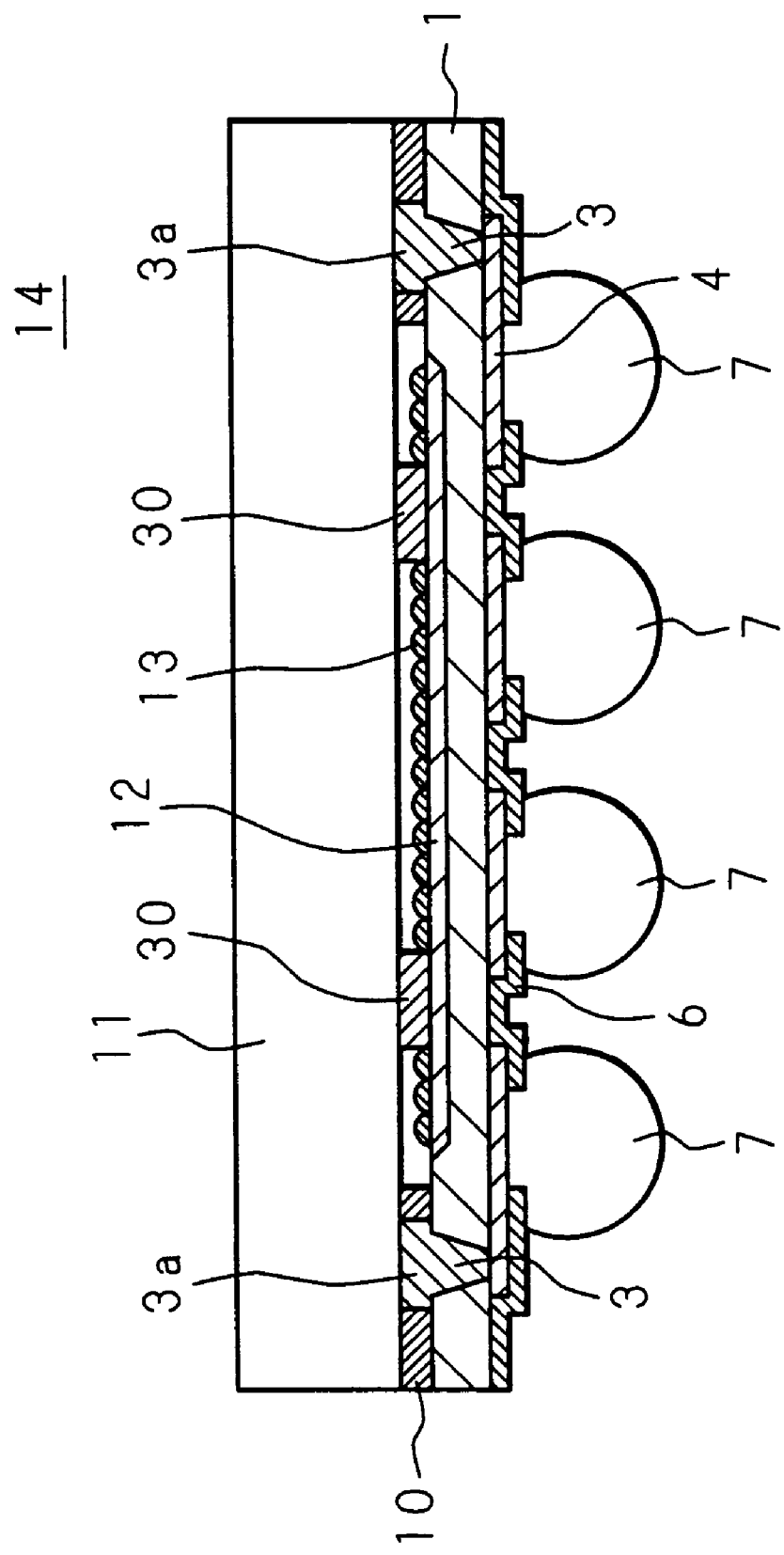
FIG. 11 is a cross sectional view showing the structure of a semiconductor device according to Embodiment 2 of the present invention.

FIG. 11 is a cross sectional view showing the structure of a semiconductor device 14 according to Embodiment 2 of the present invention. The difference between the semiconductor device 14 of this embodiment and that of Embodiment 1 is whether the semiconductor device 14 has the protruding parts 30, 30, . . . or not. Therefore, parts corresponding to Embodiment 1 are designated with the same reference codes, and explanations thereof are omitted.

The semiconductor substrate 1 has through electrodes 3, 3, . . . and protruding parts 3a, 3a, . . . which correspond one-to-one with each other. However, the number of the through electrodes 3, 3, . . . is smaller than the number of the through electrodes 3, 3, . . . in the semiconductor device 14 of Embodiment 1, or the layout of the through electrodes 3, 3, . . . is offset compared to the layout of the through electrodes 3, 3, . . . in the semiconductor device 14 of Embodiment 1, and consequently it is impossible to stably support the glass lid 11 only by the protruding parts 3a, 3a, . . . .

Therefore, the semiconductor substrate 1 has the protruding parts 30, 30, . . . protruding toward the glass lid 11 on the surface of the image pickup element 12. The protruding parts 30, 30, . . . have a thickness substantially equal to that of the protruding parts 3a, 3a, . . . , and the shape, thickness, number and layout of the protruding parts 30, 30, . . . are set so as to stably support the glass lid 11 by the protruding parts 3a, 3a, . . . and the protruding parts 30, 30, . . . .

The protruding parts 30, 30, . . . are formed by using the same material as the through electrodes 3, 3, . . . and protruding parts 3a, 3a, . . . simultaneously with the formation of the through electrodes 3, 3, . . . and protruding parts 3a, 3a, . . . by electroplating or printing and hardening a metallic paste, or following the formation of the through electrodes 3, 3, . . . and the protruding parts 3a, 3a, . . . .

On the surface of the image pickup element 12 where the protruding parts 30, 30, . . . are positioned, micro-lenses of the micro-lens part 13 are not formed. Moreover, since the glass lid 11 and the semiconductor substrate 1 are securely bonded together and sealed by the adhesive seal part 10, it is possible to bond or not to bond the top surfaces of the protruding parts 30, 30, . . . and the glass lid 11. The adhesive seal part 10 is not formed in the periphery of the protruding parts 30, 30, . . . so as not to interfere with reception of light by the image pickup element 12.

As described above, the place where the protruding parts 3a, 3a, . . . and the protruding parts 30, 30, . . . are to be formed is not limited to outside the surface of the image pickup element 12, and it is possible to form the protruding parts 3a, 3a, . . . and protruding parts 30, 30, . . . in a suitable shape, thickness, number and layout on the front surface of the semiconductor substrate 1.

Note that although the semiconductor device 14 of Embodiment 1 or 2 has a plurality of protruding parts, it may have a single protruding part. In this case, the protruding part is formed, for example, in the form of a square or C-shaped wall enclosing the image pickup element 12 and micro-lens part 13, and stably supports the glass lid 11.

Moreover, a part of the protruding parts formed on the front surface of the semiconductor substrate 1 may be formed integrally with at least one through electrode 3, or formed as a separate piece. Further, the protruding part formed integrally with the through electrode 3 may not be formed on the front surface of the semiconductor substrate 1. In the case where the protruding part is not formed on the front surface of the semiconductor substrate 1, for example, it may be possible to form an L-shaped protruding part on the edge of the semiconductor substrate 1. It may also be possible to form the protruding part on the glass lid 11, instead of forming the protruding part on the semiconductor substrate 1. Further, it may be possible to interpose spacers, which are separate pieces from the semiconductor substrate 1 and glass lid 11, between the semiconductor substrate 1 and the glass lid 11 instead of the protruding part.

If the protruding part and the through electrode 3 are separate pieces, or even if the protruding part and the through electrode 3 are formed as a single piece, it is not necessary to form the protruding part and the through electrode 3 from the exactly same material. Moreover, the protruding part may be made of metal other than Cu, or non-metallic material.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A semiconductor device comprising:
a semiconductor substrate with a semiconductor element formed in one surface thereof;
a through electrode formed in the semiconductor substrate;
a protruding part formed on said one surface of the semiconductor substrate so as to protrude from said one surface;
a lid member supported by the protruding part and attached to the semiconductor substrate to cover the semiconductor element; and
wherein the protruding part is integrally formed with the through electrode.

2. The semiconductor device according to claim 1, further comprising a micro-lens mounted on the one surface, wherein the protruding part has a thickness greater than a thickness of the micro-lens.

3. The semiconductor device according to claim 1, wherein the protruding part is formed on the one surface.

4. The semiconductor device according to claim 1, wherein the through electrode and the protruding part are formed by using the same conductive material.

5. The semiconductor device according to claim 1, wherein the protruding part is made of metal.

6. The semiconductor device according to claim 1, wherein the lid member has a light transmitting property, and the semiconductor element is a light receiving element or an image pickup element.

7. The semiconductor device according to claim 2, wherein the protruding part is formed on the one surface.

8. The semiconductor device according to claim 2, wherein the through electrode and the protruding part are formed by using the same conductive material.

9. The semiconductor device according to claim 2, wherein the protruding part is made of metal.

10. The semiconductor device according to claim 2, wherein the lid member has a light transmitting property, and the semiconductor element is a light receiving element or an image pickup element.

11. A module for optical devices, comprising: a semiconductor device as set forth in claim 1; and
an optical path defining device for defining an optical path to the semiconductor device.

12. A manufacturing method of a semiconductor device, the method comprising:
forming a semiconductor element in one surface of a semiconductor substrate;
forming a through electrode in the semiconductor substrate;
forming a protruding part protruding from the one surface on the semiconductor substrate; and
supporting a lid member by the formed protruding part and attaching the lid member to the semiconductor substrate so as to cover the semiconductor element, and wherein the protruding part is integrally formed with the through electrode after or during forming the through electrode.

13. The manufacturing method of a semiconductor device according to claim 12, further comprising the step of mounting a micro-lens on the one surface, wherein when forming the protruding part, the protruding part is formed in a thickness greater than a thickness of the micro-lens.

14. The manufacturing method of a semiconductor device according to claim 12, wherein the protruding part is formed by plating the semiconductor substrate.

15. The manufacturing method of a semiconductor device according to claim 12, wherein the protruding part is formed by printing a metallic paste on the semiconductor substrate and hardening the printed metallic paste.

16. The semiconductor device of claim 1, further comprising a micro-lens located between at least the lid member and the semiconductor substrate, and wherein the protruding part extends to an elevation above the microlens so that the protruding part and the through electrode are formed of the same conductive material.

17. The method of claim 12, further comprising providing a micro-lens located between at least the lid member and the semiconductor substrate, and wherein the protruding part extends to an elevation above the microlens so that the protruding part and the through electrode are formed of the same conductive material.

18. The semiconductor device of claim 1, wherein the lid member directly contacts the protruding part.

19. The method of claim 12, wherein the lid member directly contacts the protruding part.

* * * * *